(12) United States Patent
Inoue et al.

(10) Patent No.: US 7,951,665 B2
(45) Date of Patent: May 31, 2011

(54) SEMICONDUCTOR DEVICE HAVING CAPACITOR FORMED ON PLUG, AND METHOD OF FORMING THE SAME

(75) Inventors: Ken Inoue, Kanagawa (JP); Tomoko Inoue, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 211 days.

(21) Appl. No.: 12/292,116

(22) Filed: Nov. 12, 2008

(65) Prior Publication Data

US 2009/0140308 A1 Jun. 4, 2009

(30) Foreign Application Priority Data

Nov. 29, 2007 (JP) ................. 2007-309070

(51) Int. Cl.
*H01L 29/94* (2006.01)
(52) U.S. Cl. ............... 438/244; 257/303; 257/E21.649
(58) Field of Classification Search ............... 257/303, 257/532, E21.649; 438/244
See application file for complete search history.

(56) References Cited

U.S. PATENT DOCUMENTS

| | | | |
|---|---|---|---|
| 5,332,685 A * | 7/1994 | Park et al. | 438/107 |
| 6,184,551 B1 * | 2/2001 | Lee et al. | 257/310 |
| 6,503,794 B1 * | 1/2003 | Matsuda et al. | 438/253 |
| 6,597,032 B1 * | 7/2003 | Lee | 257/310 |
| 6,630,380 B1 * | 10/2003 | Cheng et al. | 438/253 |
| 6,743,673 B2 * | 6/2004 | Watanabe et al. | 438/253 |
| 6,759,703 B1 * | 7/2004 | Matsuhashi | 257/306 |
| 6,967,367 B2 * | 11/2005 | Kumura et al. | 257/295 |
| 6,977,402 B2 * | 12/2005 | Honma et al. | 257/295 |
| 6,995,413 B2 | 2/2006 | Inoue et al. | |
| 7,247,903 B2 | 7/2007 | Inoue et al. | |
| 7,375,389 B2 | 5/2008 | Oh et al. | |
| 2001/0025973 A1 * | 10/2001 | Yamada et al. | 257/296 |
| 2002/0098644 A1 * | 7/2002 | Ohtsuki | 438/253 |
| 2002/0195632 A1 | 12/2002 | Inoue et al. | |
| 2003/0011002 A1 * | 1/2003 | Takaura et al. | 257/200 |
| 2004/0067616 A1 * | 4/2004 | Hachisuka et al. | 438/241 |
| 2004/0173836 A1 | 9/2004 | Oh et al. | |
| 2005/0263812 A1 * | 12/2005 | Inoue et al. | 257/296 |
| 2008/0239815 A1 * | 10/2008 | Nakamura et al. | 365/185.13 |

FOREIGN PATENT DOCUMENTS

| | | |
|---|---|---|
| JP | 2001-210798 | 8/2001 |
| JP | 2003-7854 | 1/2003 |
| JP | 2004-274051 | 9/2004 |
| JP | 2004-327627 | 11/2004 |

* cited by examiner

*Primary Examiner* — Allan R Wilson
(74) *Attorney, Agent, or Firm* — McGinn IP Law, PLLC

(57) ABSTRACT

A semiconductor device includes a silicon substrate, a capacitor element having a lower electrode, a capacitor dielectric film, a TiN film, and a W film, and an interlayer insulation film covering the end and a portion of the upper surface of the lower electrode and disposed with a concave portion at a position corresponding to the lower electrode. The lower electrode is disposed selectively at the bottom of the concave portion, the upper surface of the lower electrode is exposed from the interlayer insulation film in the region for forming the concave portion, the side wall for the concave portion of the interlayer insulation film situates to the inner side of the lower electrode from the end of the lower electrode, and the capacitor dielectric film is disposed so as to cover the upper surface of the lower electrode and cover the interlayer insulation from the side wall for the concave portion to the upper surface of the interlayer insulation film.

9 Claims, 9 Drawing Sheets

SEMICONDUCTOR DEVICE HAVING CAPACITOR FORMED ON PLUG, AND METHOD OF FORMING THE SAME

BACKGROUND OF THE INVENTION

1. Field of the Invention

The present invention concerns a method of manufacturing a semiconductor device, and a semiconductor device and it particularly relates to a semiconductor device having a capacitor element.

2. Description of Related Art

Japanese Patent Application Laid Open Publication No. 2003-007854 (Patent document 1) and Japanese Patent Application Laid Open publication No. 2004-274051 (Patent document 2) disclose semiconductor devices having a cylinder type MIM (Metal Insulator Metal) capacitor. In the cylinder type MIM capacitor, a lower electrode is formed so as to cover the entire portion of a concave inner wall of an interlayer dielectric film.

Further, Japanese Patent Application Laid Open publication No. 2001-210798 (Patent document 3) and Japanese Patent Application Laid Open Publication No. 2004-327627 (Patent document 4) describe planar type MIM capacitors.

Patent document 3 discloses to form a planar type MIM capacitor by the following procedures. That is, a conductive film is formed so as to cover a contact plug formed of W, which is patterned to form a lower electrode of a capacitor over a W plug. In this case, the lower electrode is formed also over the contact plug for connecting a high concentration impurity diffusion layer and an interconnection thereover. Then, an insulation film including a dielectric material is formed so as to cover the lower electrode over the interlayer insulation film, which is patterned to form a dielectric capacitance insulation film over the lower electrode. Then, the dielectric material is sintered by oxygen annealing to conduct crystallization. Then, an upper electrode is formed by forming and patterning a conductive film as the upper electrode. Then, the contact plug for connecting the high concentration impurity diffusion layer and the interconnection thereover is removed by using lithography and dry etching. Then, an insulation film is stacked over the interlayer insulation film. The document 3 describes that during the steps described above, oxidation of the W plug in the contact plug having the capacitor elements formed thereover and the contact plug for connecting the high impurity concentration diffusion layer and the interconnection thereover can be prevented by an oxygen barrier layer contained in the lower electrode.

SUMMARY

As described above in the paragraph for the background art, tungsten (W) is used as a material for the contact plug formed in a layer just below the lower electrode of the capacitor element. Accordingly, the resistance of the capacitor contact plug cannot be lowered sufficiently and this leaves a room for the improvement in view of the operation speed of a memory cell.

Further, referring to the planar type MIM capacitor, when the planar type MIM capacitor is formed by the method described above with reference to Patent document 3, an interlayer insulation film as a lower layer of a capacitor element is formed, then a lower electrode of the capacitor element is formed and then an interlayer insulation film situating at a level identical with the capacitor element is formed. Accordingly, the surface of the contact plug formed in a layer identical with the contact plug connected to the bottom of the lower electrode is exposed by a large number of times in this step and it tends to suffer from the effect of oxidation. Further, it also results in a problem that the surface of the contact plug suffers from damages by dry etching on every exposure.

FIGS. 9 to 11 show that the contact plug is exposed by a large number of times upon formation of the planar type MIM capacitor.

FIG. 9 is a cross sectional view showing a semiconductor device 120 having a planar type capacitor element and FIGS. 10A and 10B and FIG. 11 are cross sectional views showing manufacturing steps therefor.

In the semiconductor device 120 shown in FIG. 9, a capacitor element is a parallel plate type capacitor element in which the capacitor element includes a lower electrode 169, a capacitor dielectric film 171, a TiN film 173, and a W film 175, and the capacitor element is buried in an interlayer insulation film 109.

The semiconductor device 120 is manufactured, for example, by the following procedures. At first, as shown in FIG. 10A, a device isolation region 102 and a transistor are formed at a predetermined position on the device forming surface of a silicon substrate 101. Then, an SiN film 103 and an interlayer insulation film 105 are formed successively over the entire device forming surface of the silicon substrate 101, the insulation films are removed selectively over a diffusion layer 113, and first and second connection holes passing through the insulation films are formed. Then, a barrier metal film and a W film are formed over the entire surface of the interlayer insulation film 105. The W film is formed so as to fill each of the connection holes. Then, by removing the W film and the barrier metal film formed to the outside of each of the connection holes, a W plug 191, a W plug 192, and a W plug 193 to be connected to the respective diffusion layers 113 are formed.

Then, a lower electrode 169 is formed over the W plug 192. In this case, the upper surface of the W plug 193 is exposed. Then, a high dielectric constant film 177, a TiN film 179, and a W film 181 are formed over the entire upper surface of the interlayer insulation film 105, and they are fabricated into a predetermined planar shape to obtain a capacitor element (FIG. 10B). During the fabrication step for the high dielectric constant film 177, the TiN film 179, and the W film 181, the upper surface of the W plug 193 is exposed again. Then, an interlayer insulation film 109 is formed over the interlayer insulation film 105, a connection hole 183, and a connection hole 185 are formed (FIG. 11), and a W plug 194 and a W plug 195 are formed respectively so as to fill them. Further, a W plug 196 is formed so as to fill the connection hole in the logic area. The upper surface of the W plug 193 is exposed again during formation of the connection hole 185.

Therefore, the upper surface of the W plug 193 is exposed three times in total.

An aspect of the present invention provides a method of manufacturing a semiconductor device which includes:

forming first and second connection plugs at an identical level over a semiconductor substrate, forming a lower electrode covering the upper surface of the first connection plug, forming a first insulation film covering the portion over the lower electrode and the second connection plug, selectively removing the first insulation film to expose a portion over the upper surface of the lower electrode, thereby forming a concave portion with the upper surface of the lower electrode being as a bottom surface and with the lateral side of the first insulation film being as a side wall, forming a capacitor dielectric film for covering the upper surface of the lower electrode, the side wall of the first insulation film, and the upper surface of the first insulation film, from the bottom of the concave portion to the outside of the concave portion over the first insulation film formed with the concave portion, forming an upper electrode opposed to the lower electrode and in contact with the capacitor dielectric film so as to fill the inside of the concave portion, and removing the first insulation film over the second connection plug selectively to form a connection hole after the step of forming the upper electrode, forming a first conduction film so as to fill the connection hole and removing the first conduction film disposed to the outside of the connection hole, thereby forming a third connection plug to be connected with the second connection plug.

In the manufacturing method of the invention, after forming the first insulation film covering the portion over the lower electrode and the second connection plug and forming the capacitor element connected to the lower electrode, the first insulation film over the second connection plug is removed selectively to form the connection hole. This can prevent the exposure of the upper surface of the second connection plug in the step of forming the capacitor dielectric film or the upper electrode of the capacitor element. Accordingly, also in a case of forming the material of the second connection plug with a copper-containing metal or the like, oxidation for the upper surface of the second connection plug or increase in the connection resistance at the upper surface of the plug can be suppressed effectively. Therefore, according to the manufacturing method, it is possible to stably manufacture a semiconductor device excellent in the degree of freedom for the selection of the material of the second connection plug formed in the layer identical with the first connection plug connected to the lower electrode of the capacitor element.

Further, the invention provides a semiconductor device which includes:

a semiconductor substrate, a capacitor element disposed over the semiconductor substrate and having a lower electrode, an upper electrode, and a capacitor dielectric film disposed between the upper electrode and the lower electrode, and a first insulation film covering the end and a portion of the upper surface of the lower electrode, and disposed with a concave portion at a position corresponding to the lower electrode, in which the lower electrode is disposed selectively at the bottom of the concave portion and the upper surface of the lower electrode is exposed from the first insulation film in a region for forming the concave portion, the side wall of the concave portion of the first insulation film situates on the inner side of the lower electrode from the end of the lower electrode, and the capacitor dielectric film is disposed so as to cover the upper surface of the lower electrode and cover the first insulation film from the side wall of the concave portion to the upper surface of the first insulation film.

Since the semiconductor device of the invention can be manufactured by the manufacturing method of the semiconductor device according to the invention as described above, it is excellent in the degree of freedom for selecting the material of the connection plug formed in the layer identical with the plug connected to the lower electrode of the capacitor element. Therefore, this can provide a structure excellent in the stability for manufacture and capable of improving the operation speed of a memory cell.

As has been described above, the invention can improve the stability for the manufacture of the semiconductor device having the capacitor element.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
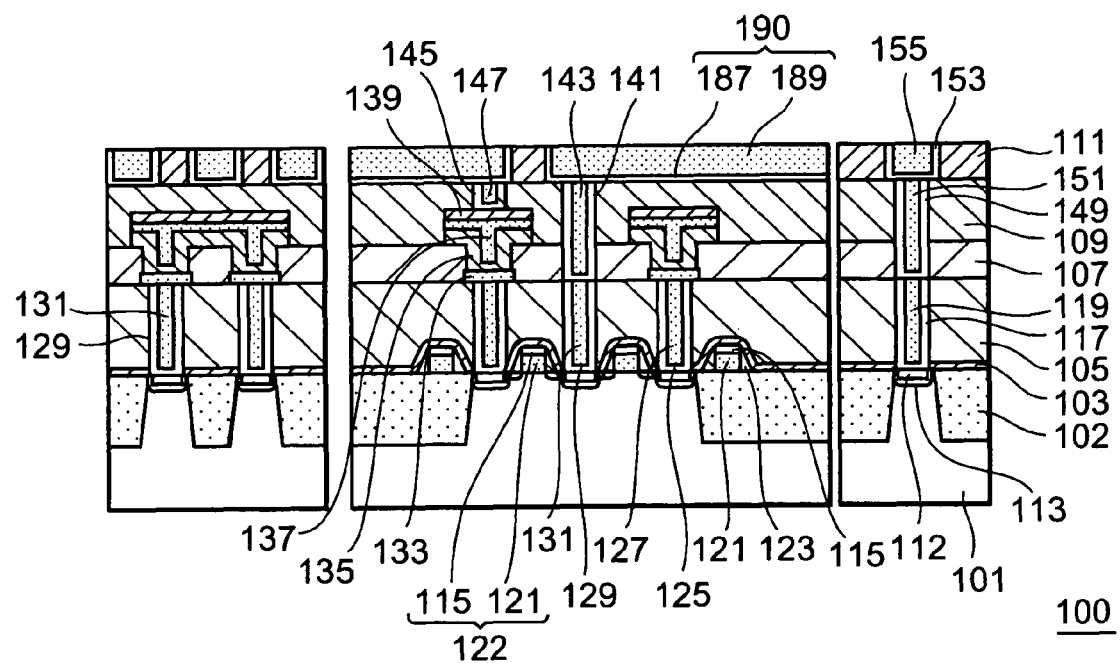
FIG. 1 is a cross sectional view showing the constitution of a semiconductor device in an exemplary embodiment of the present invention.

FIG. 1 is a cross sectional view showing the constitution of a semiconductor device in an exemplary embodiment of the present invention. For three cross sectional views in FIG. 1, a drawing at the center is a cross sectional view in a direction perpendicular to a word line in a memory area, a drawing on the left is a cross sectional view in a direction perpendicular to a bit line in a memory area. Further, the drawing on the right is a cross sectional view in a logic area. Also in FIG. 2 to FIG. 11 to be described later, such three cross sectional views are shown as a set of combination.

A semiconductor device 100 shown in FIG. 1 is a device in which a memory area and a logic area are hybridized and includes a semiconductor substrate (silicon substrate 101), a capacitor element, and a first insulation film (interlayer insulation film 107).

The capacitor element is disposed over the silicon substrate 101, and includes a lower electrode 133, an upper electrode (Titanium Nitride (TiN) film 137, W film 139), and a capacitor dielectric film 135 disposed between the TiN film 137 and the lower electrode 133.

The interlayer insulation film 107 covers a portion for the end and the upper surface of the lower electrode 133 and is formed with a concave portion 163 (FIG. 3A) at a position corresponding to the lower electrode 133. The concave portion 163 penetrates the interlayer insulation film 107, and the side wall for the concave portion of the inter-insulation film 107 situates on the inner side of the lower electrode 133 from the end of the lower electrode 133.

The lower electrode 133 is disposed selectively at the bottom of the concave portion 163, and the upper surface of the lower electrode 133 is exposed from the interlayer insulation film 107 in the region for forming the concave portion 163. The lower electrode 133 is in contact at the lower surface with the first connection plug comprising a barrier metal film 125 and a first Cu plug 127.

The lateral side of the interlayer insulation film 107 forming the side wall of the concave portion is not covered with the lower electrode 133 and disposed in contact with the capacitor dielectric film 135. The capacitor dielectric film 135 covers the upper surface of the lower electrode 133 and disposed so as to cover the interlayer insulation film 107 from the side wall of the concave portion to the upper surface of the interlayer insulation film 107.

The upper electrode comprising the TiN film 137 and the W film 139 is disposed so as to fill the concave portion 163. The TiN film 137 is disposed in contact with the upper surface of the capacitor dielectric film 135 and opposed to the capacitor dielectric film 135. Further, the TiN film 137 covers the inner lateral surface of the capacitor dielectric film 135. Further, the W film 139 has a planar shape identical with the TiN film 137. The W film 139 is in contact at the upper surface with a connection plug comprising a barrier metal film 145 and a copper (Cu) plug 147.

Further, transistors are disposed in the memory area and the logic area. The transistor has a gate electrode 122 disposed over the silicon substrate 101 and first and second impurity diffusion layer regions (diffusion layer 113) disposed to the silicone substrate 101 on both sides of the gate electrode 122. In FIG. 1, a polysilicon electrode 121 and a silicide layer 115 constitute the gate electrode 122. The gate electrode 122 functions as a word line.

The first connection plug connects the first impurity diffusion region (diffusion layer 113 on one side) and the lower electrode 133 and comprises a copper-containing metal (copper (Cu), for example). Further, the second connection plug is connected to the second impurity diffusion region (diffusion layer 113 on the other side) and comprises a copper-containing metal (Cu, for example).

Over the silicon substrate 101 provided with the transistor, a SiN film 103, an interlayer insulation film 105, an interlayer insulation film 107, an interlayer insulation film 109, and an interlayer insulation film 111 are stacked in this order. Among them, in the interlayer insulation film 105, the first connection plug described above, a second connection plug comprising a barrier metal film 129 and a second Cu plug 131, and a connection plug comprising a barrier metal film 117 and a Cu plug 119 in the logic area are disposed. The connection plugs are connected with the diffusion layer 113 of the silicon substrate 101 in the memory area or the logic area. Further, the second connection plug is in contact at the upper surface with the third connection plug comprising a barrier metal film 141 and a third Cu plug 143, and the connection plug in the logic area is in contact at the upper surface with a connection plug comprising a barrier metal film 149 and a Cu plug 151. Both the third Cu plug 143 and the Cu plug 151 are disposed from the interlayer insulation film 107 to the interlayer insulation film 109, while penetrating the insulation films.

The Cu plug 147 and the third Cu plug 143 are connected at the upper surface with an interconnection 189 buried in the interlayer insulation film 111. The interconnection 189 connected with the third Cu plug 143 is disposed in a layer identical with the first interconnection 155 in the logic area. The interconnection 189 and the barrier metal film 187 function as a bit line 190. The interconnection 189 is disposed in a layer identical with the first interconnection 155 of the logic area. The bit line 190 is connected by way of the third Cu plug 143 to the upper portion of the second Cu plug 131. Further, the Cu plug 151 is connected with an interconnection 189 buried in the interlayer insulation film 111.

Figure 3A:
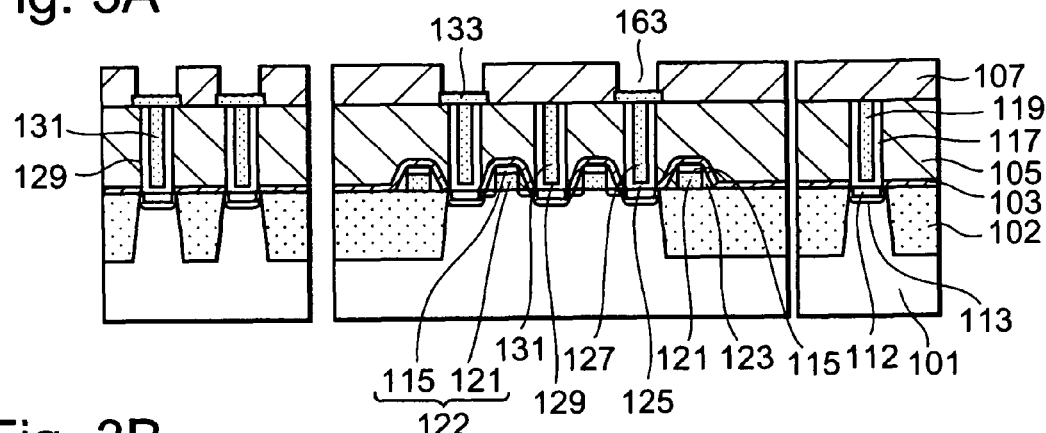
FIGS. 3A to 3C are cross sectional views each showing manufacturing steps of a semiconductor device in FIG. 1.
Figure 3B:
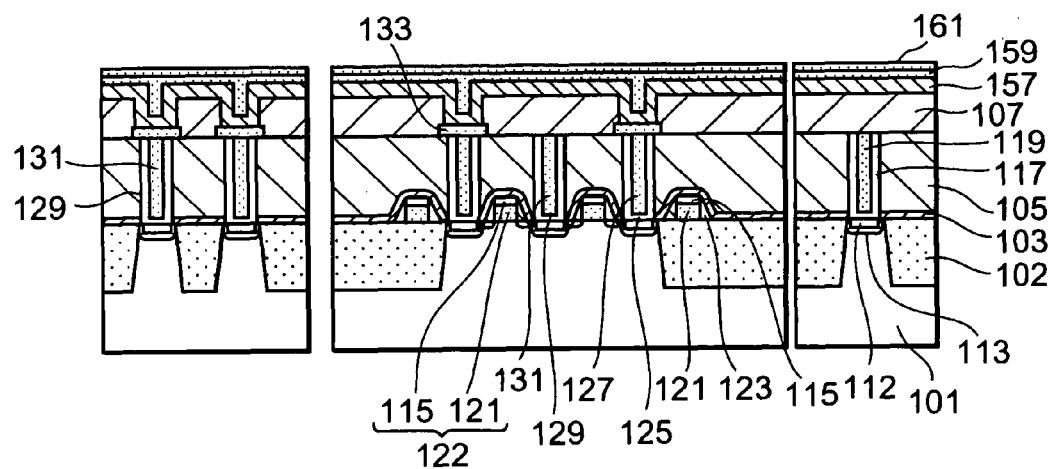
Figure 3C:
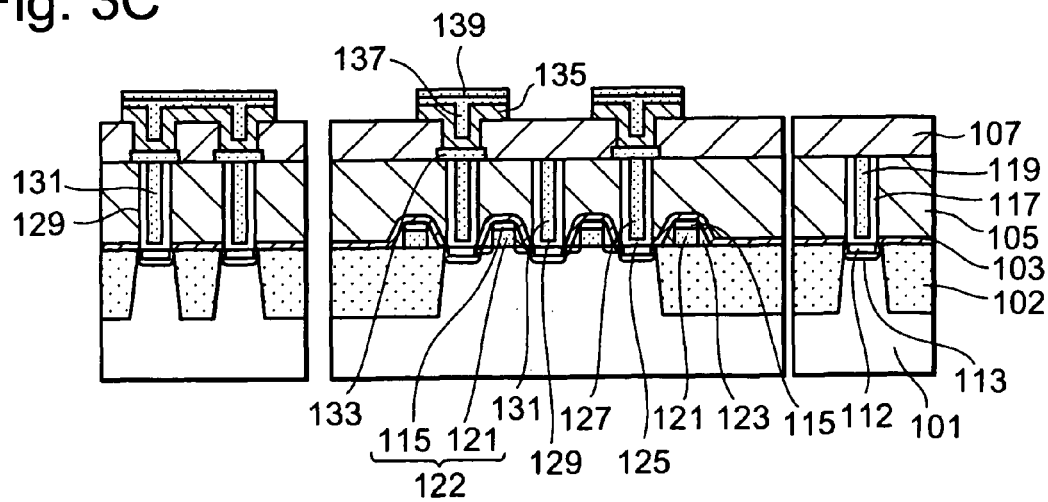
Figure 4:
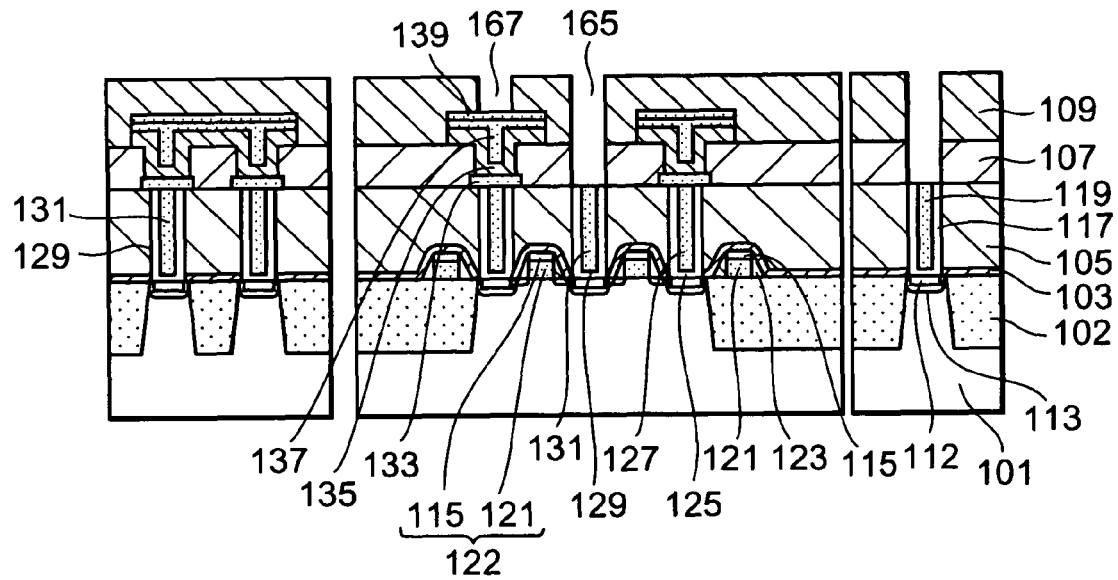
FIG. 4 is a cross sectional view showing manufacturing steps of a semiconductor device in FIG. 1.

FIG. 2 to FIG. 4 are cross sectional views showing the manufacturing steps for the semiconductor device 100.

The method of manufacturing the semiconductor device 100 in the exemplary embodiment includes the following steps:

Step 11: forming a first connection plug (barrier metal film 125, first Cu plug 127) and a second connection plug (barrier metal film 129, second Cu plug 131) at an identical level over the silicon substrate 101, Step 12: forming a lower electrode 133 covering the upper surface of the first connection plug, Step 13: forming an interlayer insulation film 107 covering the portion over the lower electrode 133 and the second connection plug, Step 14: selectively removing the interlayer insulation film 107 to expose a portion for the upper surface of the lower electrode 133 thereby forming a concave portion 163 with the upper surface of the lower electrode 133 being as a bottom surface and with the lateral surface of the interlayer insulation film 107 being as a side wall, Step 15: forming a capacitor dielectric film 135 for covering the upper surface of the lower electrode 133, the side wall of the interlayer insulation film 107, and the upper surface of the interlayer insulation film 107 over the interlayer insulation film 107 formed with the concave portion 163 from the bottom of the concave portion 163 to the outside of the concave portion 163, Step 16: forming an upper electrode (TiN film 137, W film 139) which is opposed to the lower electrode 133 and in contact with the capacitor dielectric film 135 so as to fill the inside of the concave portion 163, and Step 17: selectively removing the interlayer insulation film 107 over the second connection plug to form a connection hole 165 (FIG. 4) and forming a first conduction film (Cu film) so as to bury the connection hole 165 and removing the Cu film disposed to the outside of the connection hole, thereby forming a third connection plug (barrier metal film 141, third Cu plug 143) connected to the second connection plug.

The method of manufacturing the semiconductor device 100 is to be described more specifically.

Figure 2A:
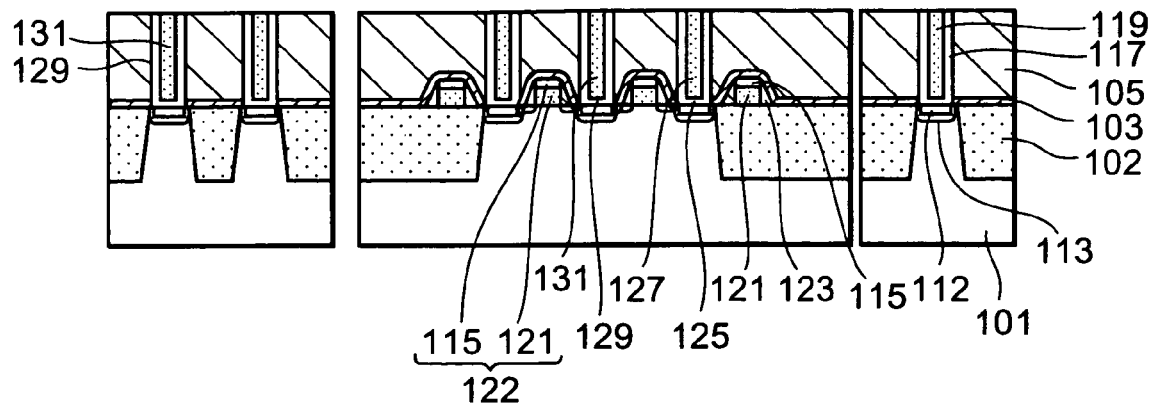
FIGS. 2A to 2C are cross sectional views each showing manufacturing steps of a semiconductor device in FIG. 1.

At first, as shown in FIG. 2A, a device isolation region 102 and a transistor are formed at predetermined positions on the device forming surface of the silicon substrate 101. This step includes forming a gate insulation film (not illustrate) and a polysilicon electrode 121 over the silicon substrate 101, forming a diffusion layer 113 on both sides of a polysilicon electrode 121, a step of forming a side wall insulation film 123 on both sides of the polysilicon electrode 121, and forming a silicide layer 112 and a silicide layer 115 respectively over the diffusion layer 113 and the polysilicon electrode 121. Then, an SiN film 103 and a second insulation film (interlayer insulation film 105) are formed successively over the entire device forming surface of the silicon substrate 101. Then, such insulation films are removed selectively over the diffusion layer 113, to form first and second connection holes penetrating the insulation films. Then, a barrier metal film and a Cu film are formed over the entire surface of the upper portion of the interlayer insulation film 105. The Cu film is formed so as to fill the respective connection holes. Then, by removing the Cu film and the barrier metal film formed to the outside of each of the connection holes, first and second connection plugs connected to each of the diffusion layers 113 are formed at an identical level. "Identical level" means herein that they are disposed as an identical layer. The first and the second connection plugs are disposed in contact with the diffusion layer 113 by way of the silicide layer 112 over the diffusion layer 113.

Figure 2B:
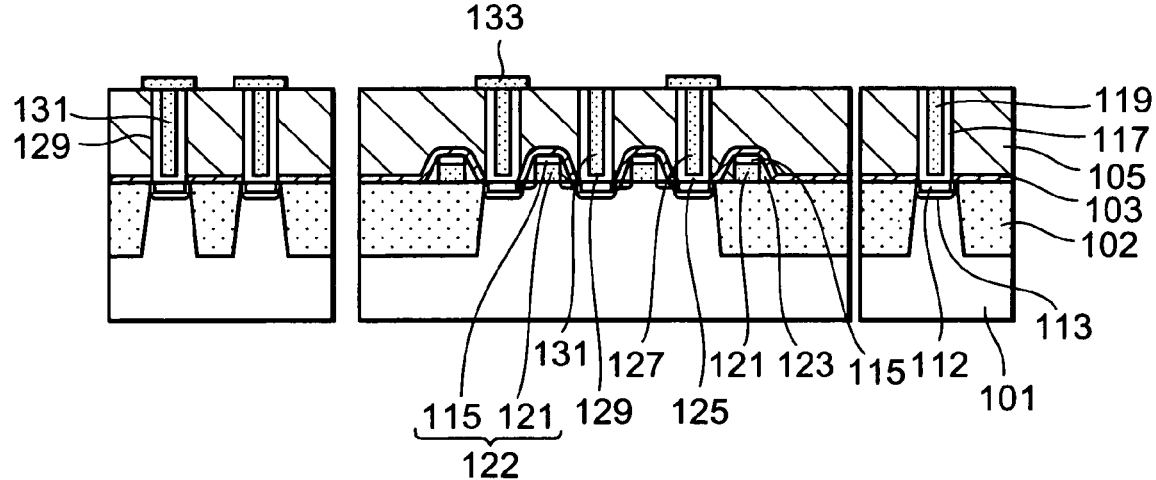
Figure 2C:
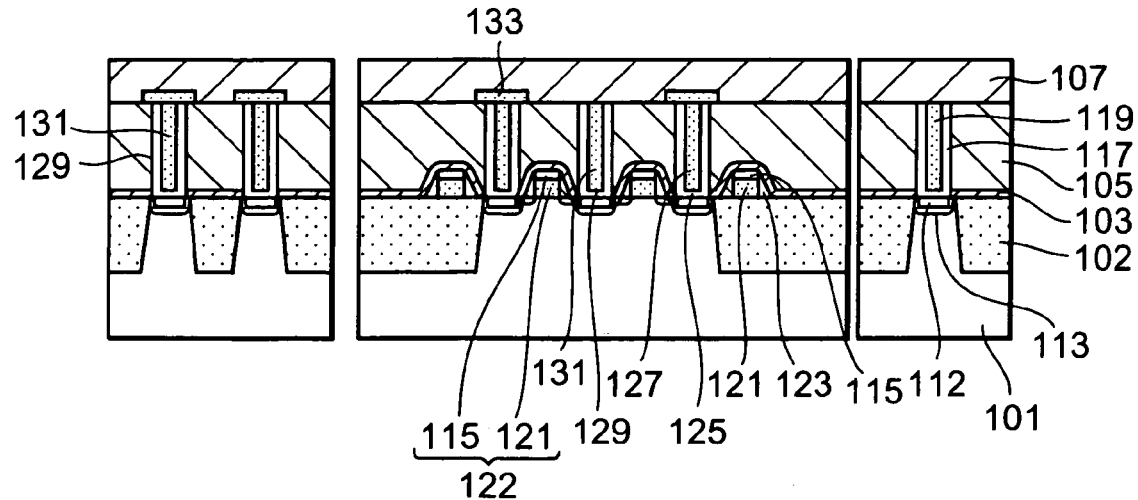

Then, a TiN film as the lower electrode 133 is formed above the entire surface of the interlayer insulation film 105, and the regions except for the portion over the first connection plug having the barrier metal film 125 and the first Cu plug 127 and the vicinity thereof are removed selectively to form a lower electrode 133 (FIG. 2B). In this step, the upper surface of the second Cu plug 131 is exposed. Then, an interlayer insulation film 107 is formed in contact with the interlayer insulation film 105 so as to cover the lower electrode 133 (FIG. 2C).

Successively, the interlayer insulation film 107 is removed selectively from the region for forming the lower electrode 133 to form a concave portion 163. The side wall for the concave portion 163 is formed of the interlayer insulation film 107 and the bottom thereof is formed of the lower electrode 133 (FIG. 3A).

Then, a high dielectric constant film 157, a TiN film 159, and a W film 161 are formed successively over the silicon substrate 101 formed with the concave portion 163 (FIG. 3B), and they are fabricated each into a predetermined planar shape thereby forming a capacitor dielectric film 135, a TiN film 137, and a W film 139 (FIG. 3C).

An interlayer insulation film 109 is formed so as to cover the entire surface over the interlayer insulation film 107 formed with the capacitor element as described above. Then, the interlayer insulation film 109 is removed selectively at the position corresponding to the W film 139, the second Cu plug 131, and the Cu plug 119 to form a connection hole 165, a connection hole 167 and a connection hole in the logic area (FIG. 4). In this step, the upper surface of the second Cu plug 131 is exposed. Then, a barrier metal film and a Cu film are formed so as to fill the connection holes, and the Cu film and the barrier metal film formed to the outside of the connection holes are removed to form a Cu plug 147, a third Cu plug 143, and a Cu plug 151.

Then, an interlayer insulation film 111 is formed over the interlayer insulation film 109, interconnection trenches are formed at predetermined positions, a barrier metal film 187 and an interconnection 189 are formed in the interconnection trenches in the memory area, and a barrier metal film 153 and a first interconnection film 155 are formed in the interconnection trench in the logic area. The step corresponds to forming the bit line 190 connected to the third Cu plug 143. With the procedures described above, the semiconductor device 100 shown in FIG. 1 is obtained. In the procedures described above, the upper surface of the second Cu plug 131 is exposed twice in total. Further, after the procedures described above, an interconnection may further be stacked over the silicon substrate 101.

The function and the effect of this exemplary embodiment are to be described below.

After forming the lower electrode 133, the interlayer insulation film 107 is formed before forming the capacitor dielectric film 135 and the upper electrode. Then, upon forming the capacitor dielectric film 135 and the upper electrode, the interlayer insulation film 107 is removed selectively from the region corresponding to the lower electrode 133 of the capacitor element. Since this method can prevent exposure of the upper surface of the second Cu plug 131 during forming the capacitor element, oxidation for the upper surface of the second Cu plug 131 can be suppressed. Accordingly, also in a case of using Cu as the material of the connection plug in direct connection with the diffusion layer 113, increase in the connection resistance due to surface oxidation can be suppressed effectively.

Figure 9:
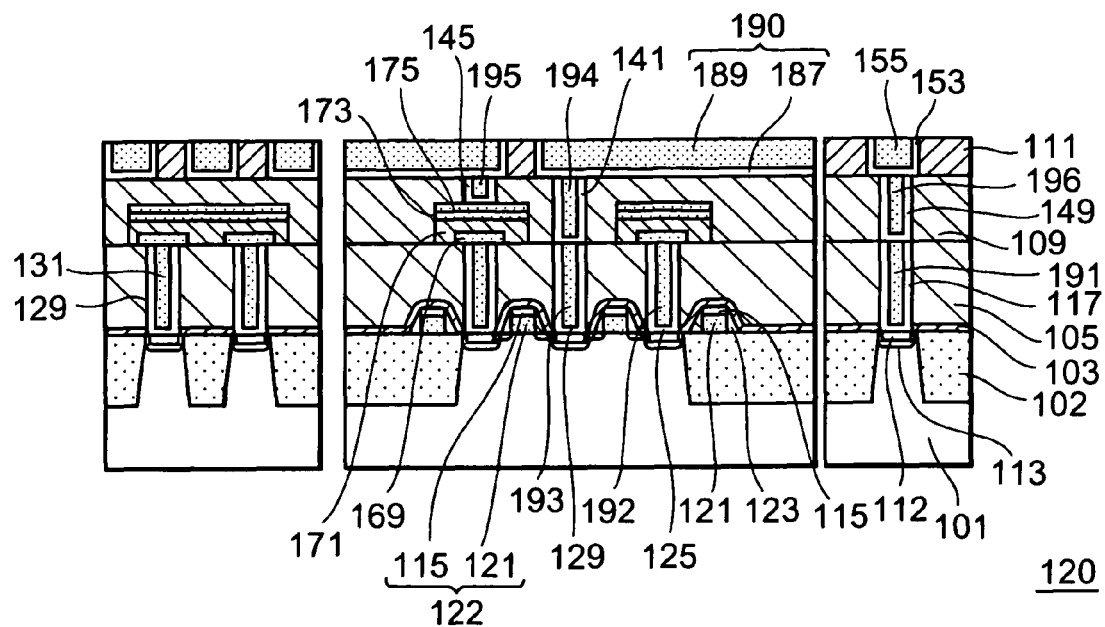
FIG. 9 is a cross sectional view showing the constitution of a semiconductor device of a related art.
Figure 10A:
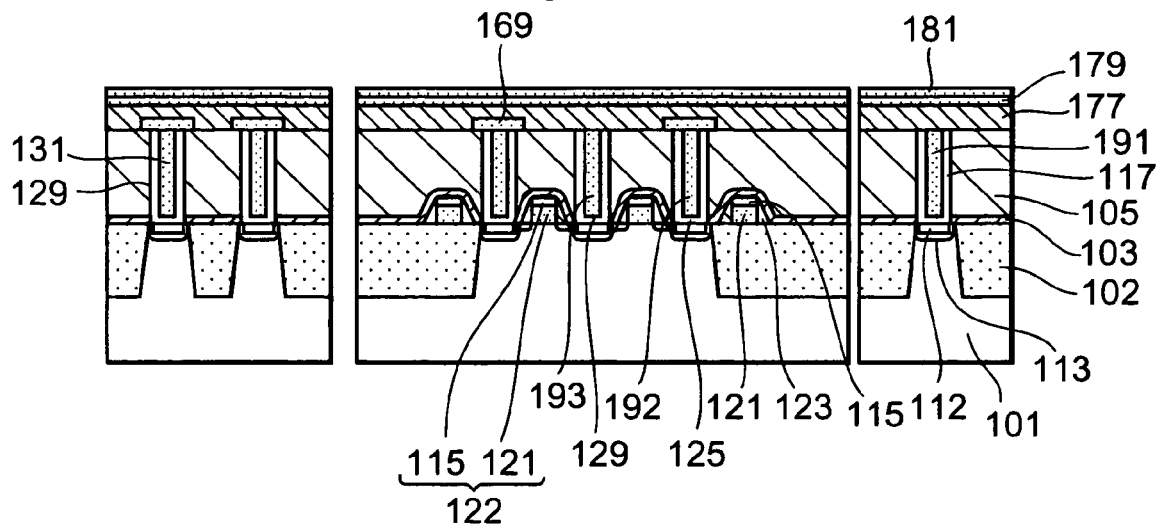
FIGS. 10A and 10B are cross sectional views each showing manufacturing steps of a semiconductor device in FIG. 9.
Figure 10B:
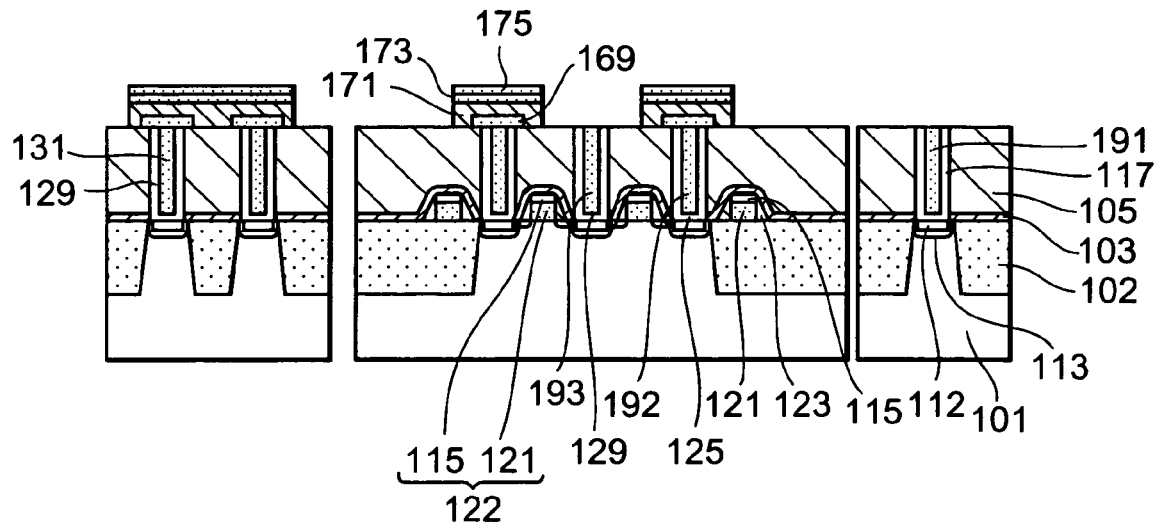
Figure 11:
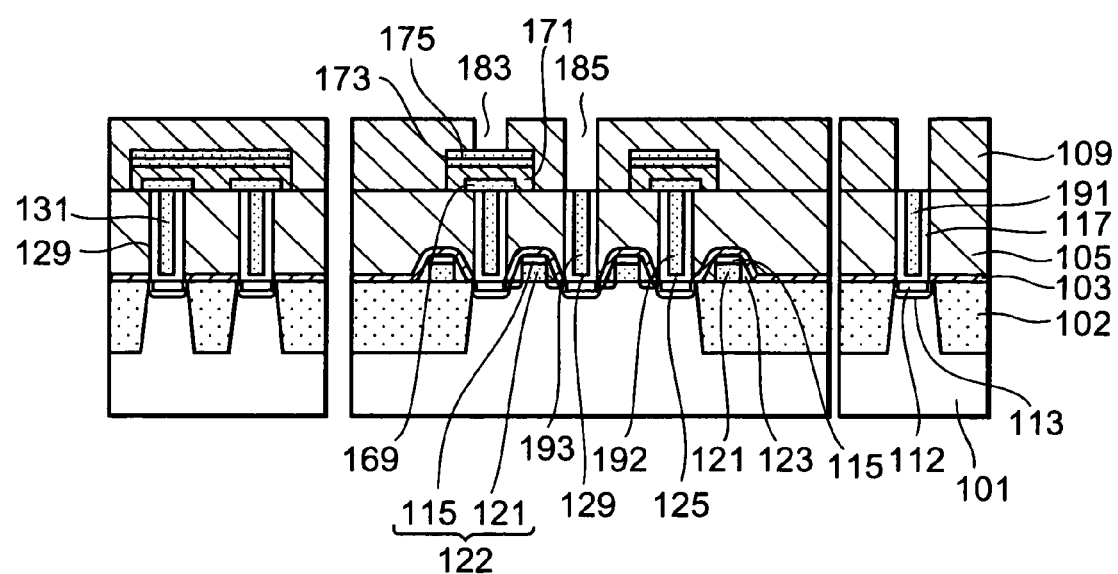
FIG. 11 is a cross sectional view showing manufacturing steps of a semiconductor device in FIG. 9.

The following is an explanation which describes the effect of the exemplary embodiment in comparison with the semiconductor device 120 having the planar type capacitor element of FIG. 9.

The semiconductor device 120 is different from the semiconductor device 100 shown in FIG. 1 in that the capacitor element is a parallel plate type capacitor element comprising the lower electrode 169, the capacitor dielectric film 171, the TiN film 173, and the W film 175, the capacitor element is buried in the interlayer insulation film 109, and the interlayer insulation film 107 is not disposed.

In case where the semiconductor device 120 is formed, the upper surface of the W plug 193 is exposed three times in total as described above with reference to FIG. 10 and FIG. 11, that is, during formation of the lower electrode 169, in the etching step for fabricating the high dielectric constant film 177, the TiN film 179, and the W film 181 each into the shape of the capacitor dielectric film 171 and the upper electrode (FIG. 10(*b*)), and during formation of the connection hole 185. Accordingly, the plug surface tends to be oxidized to possibly increase the connection resistance. Therefore, a W plug is to be used as a plug for connection with the diffusion layer 113, and it was difficult to dispose a Cu plug to the layer just below the capacitor element.

On the contrary, as described above with reference to FIG. 3A to FIG. 3C, this exemplary embodiment has a structure which can be formed without exposing the upper surface of the second Cu plug 131 during formation of the capacitor dielectric film 135 and the upper electrode of the capacitor element. Accordingly, compared with the case of FIG. 9 to FIG. 11, the number of times for exposing the upper surface of the second Cu plug 131 in the step is decreased to twice in total, i.e., during formation of the lower electrode 133 (FIG. 2B) and during formation of the connection hole 165 (FIG. 4). Accordingly, also in a case of using a Cu plug for the layer just below the capacitor element, increase in the connection resistance due to oxidation for the surface can be suppressed. Therefore, the operation speed of the memory cell can be improved in cooperation with the decrease in the resistance of the plug by the use of Cu. Further, since oxidation on the surface of the second Cu plug 131 is suppressed, the stability in manufacture of the device can be improved in addition to the decrease in the connection resistance. Further, also for the logic area, since the material for the connection plug (Cu plug 119) connected to the diffusion layer 113 of the transistor can be formed of Cu, the operation characteristics of the transistor can be improved.

Second Exemplary Embodiment

Figure 5:
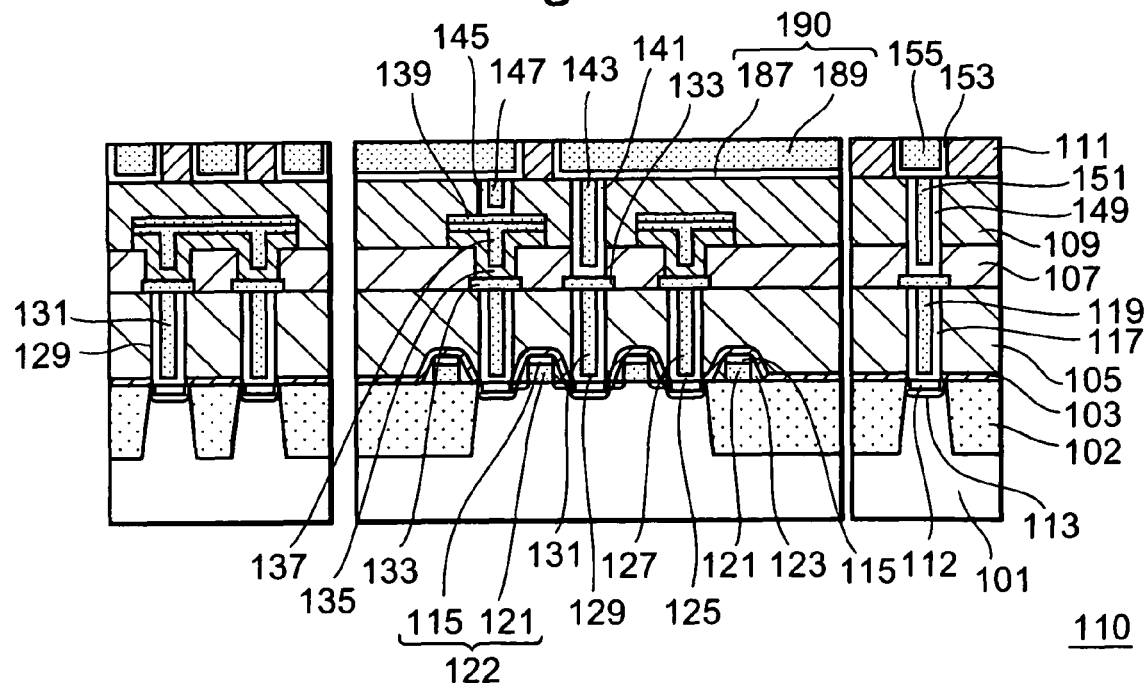
FIG. 5 is a cross sectional view showing the constitution of a semiconductor device in another exemplary embodiment of the present invention.

FIG. 5 is a cross sectional view showing a semiconductor device 110 in a second exemplary embodiment. While the basic constitution of the semiconductor device 110 is identical with the semiconductor device 100 (FIG. 1), it is different in that the lower electrode 133 is disposed also over a second Cu plug 131.

The semiconductor device 110 can be obtained by using the manufacturing method for the semiconductor device 100. FIG. 6 to FIG. 8 are cross sectional views showing the procedure of forming the semiconductor device 110.

Figure 6A:
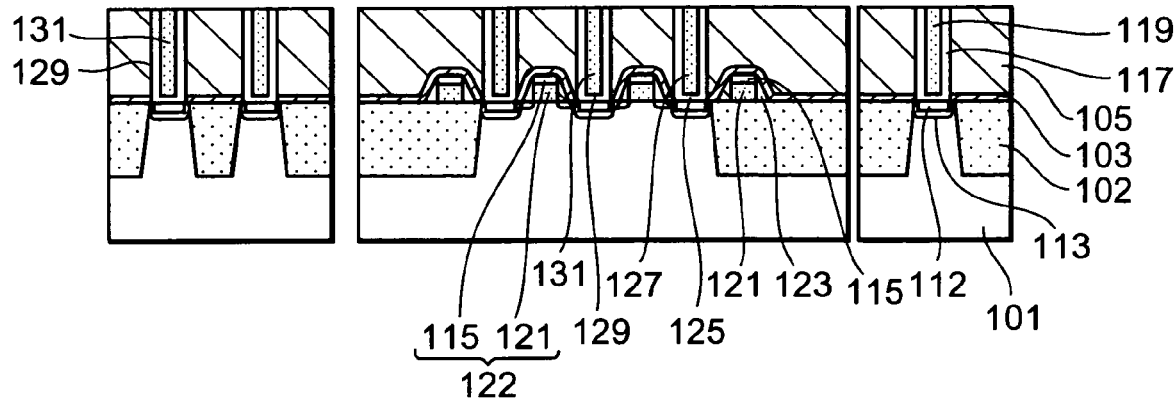
FIGS. 6A to 6C are cross sectional views each showing manufacturing steps of a semiconductor device in FIG. 5.

As shown in FIG. 2A, an interlayer insulation film 105 is formed over a silicon substrate 101, and a second Cu plug 131, a first Cu plug 127, and a Cu plug 119 are formed in the interlayer insulation film 105 (FIG. 6A).

Figure 6B:
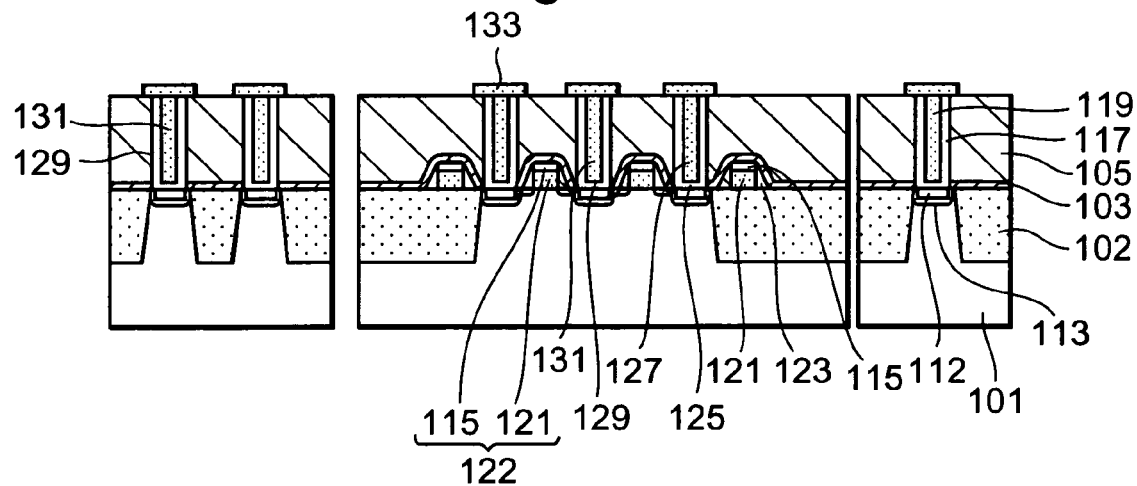
Figure 6C:
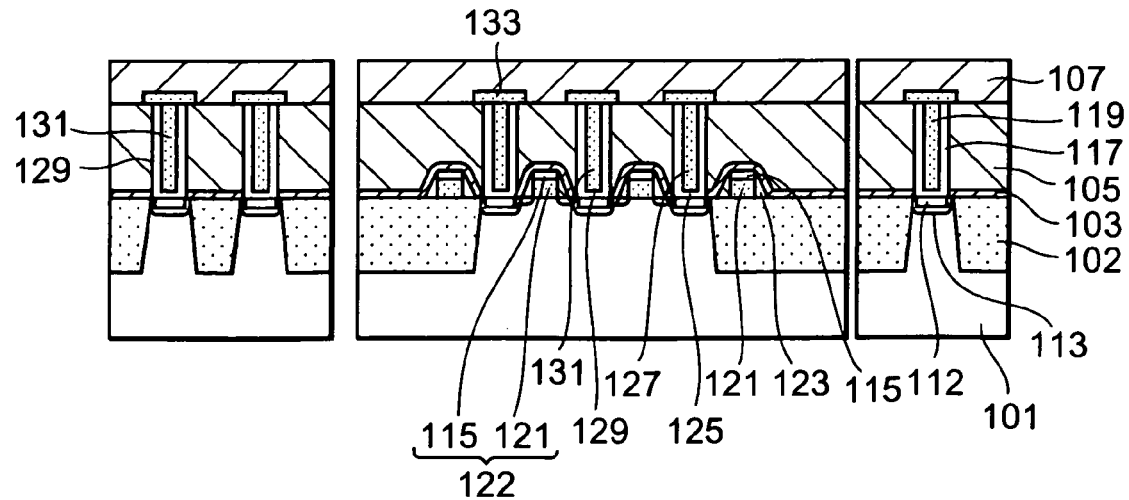

Successively, a lower electrode 133 is formed as shown in FIG. 2B. In this step, an electrode (lower electrode 133) covering the upper surface of the second Cu plug 131 which is disposed being spaced apart from the lower electrode 133 over the first Cu plug 127 is formed simultaneously at an identical level (FIG. 6B). As the material for the lower electrode 133, a conductor film such as a TiN film can be used for instance. Then, as described in FIG. 2C, an interlayer insulation film 107 covering the lower electrode 133 is formed over the interlayer insulation film 105 over the entire surface (FIG. 6C).

Figure 7A:
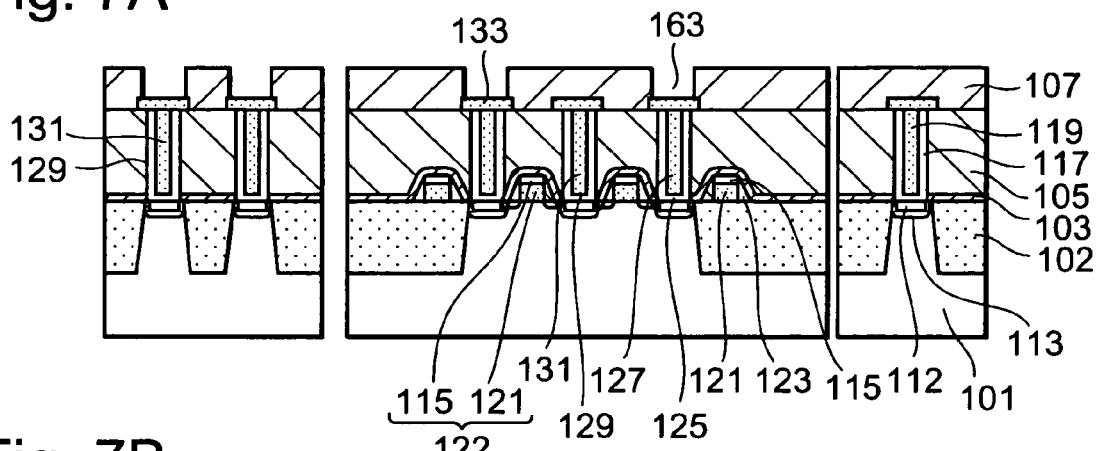
FIGS. 7A to 7C are cross sectional views each showing manufacturing steps of a semiconductor device in FIG. 5.
Figure 7B:
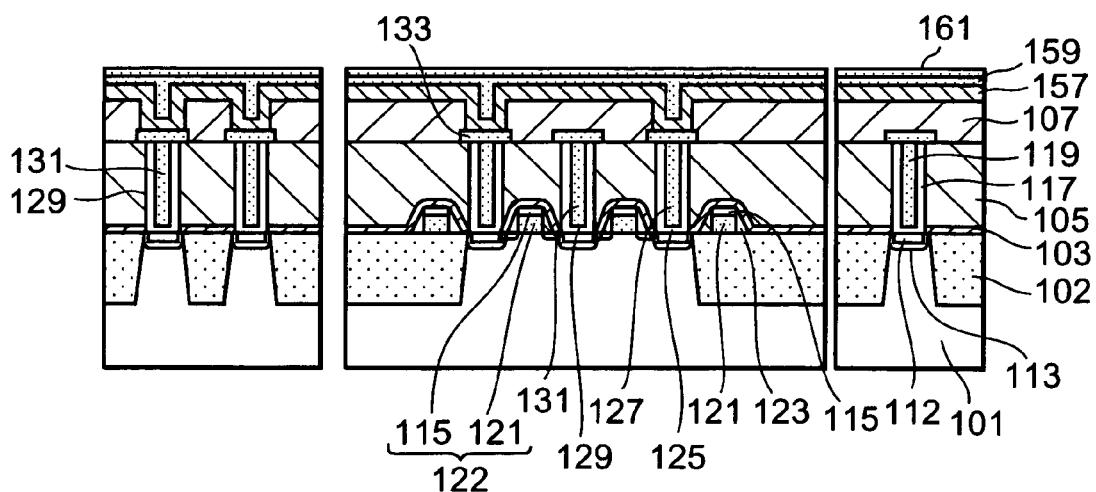
Figure 7C:
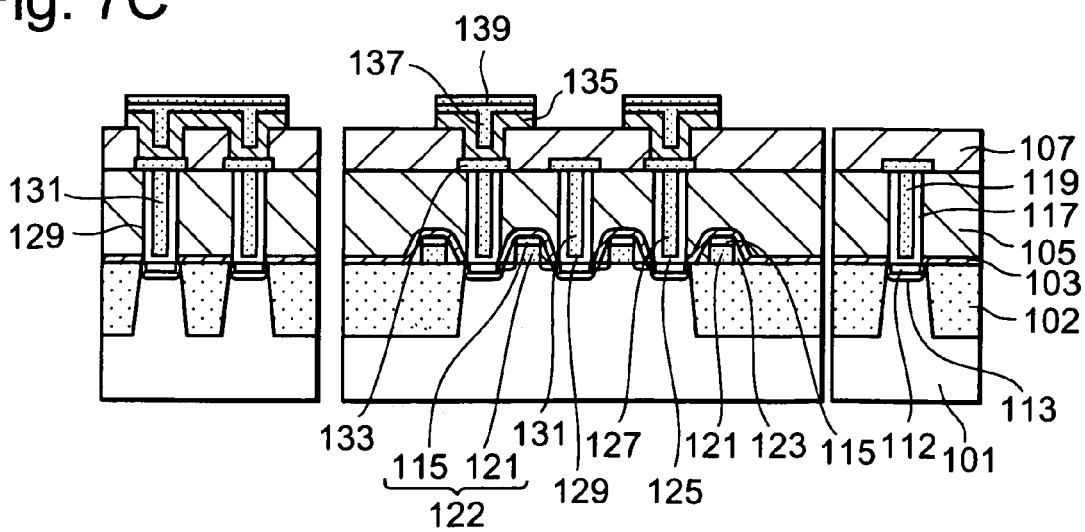
Figure 8:
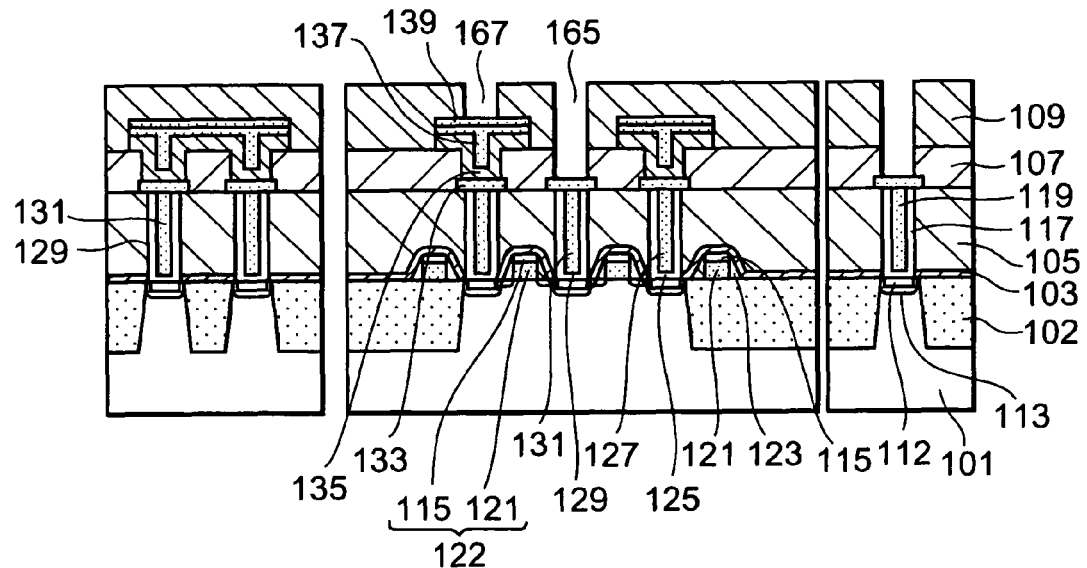
FIG. 8 is a cross sectional view showing manufacturing steps of a semiconductor device in FIG. 5.

Then, as shown in FIG. 3A to FIG. 3C, a concave portion 163 and a capacitor element filling the same are formed (FIG. 7A to FIG. 7C).

Then, each of connection holes is formed as described in FIG. 4 and a connection plug is formed in the connection hole. In this case, since the bottom of the connection hole connected to the second Cu plug 131 is formed by the lower electrode 133, the third connection plug comprising the barrier metal film 141 and the third Cu plug 143 is formed in contact with the upper surface of the lower electrode 133. Then, the semiconductor device 110 shown in FIG. 5 is obtained by forming the interconnection layer as described by the first exemplary embodiment. The upper surface of the second Cu plug 131 is therefore not exposed even once.

In this exemplary embodiment, since the lower electrode 133 is formed also over the second Cu plug 131, the upper surface of the second Cu plug 131 is not exposed even once after formation thereof during the manufacturing steps. Accordingly, in addition to the function and the effect obtained in the first exemplary embodiment, oxidation for the upper surface of the second Cu plug 113 can be suppressed more reliably. Accordingly, also in a case of forming the material of the connection plug just over the diffusion layer 113 of Cu, increase in the contact resistance due to oxidation of the upper surface can be suppressed more effectively. Therefore, the operation speed of the memory cell can further be improved.

Further, since the lower electrode 133 is formed over the Cu plug 119 also in the logic area, the upper surface of the Cu plug 119 is not exposed during formation of the capacitor element. Therefore, since the oxidation of the Cu plug 119 can also be suppressed further reliably, the operation characteristics of the transistor in the logic area can be improved further.

While descriptions have been made to the exemplary embodiments of the invention with reference to the drawings, they are examples of the invention and various other constitutions than described above can also be adopted.

For example, in the exemplary embodiments described above, while descriptions have been made to the example of a CUB (capacitor under bit line) structure, a positional relation between the bit line and the capacitor element is not restricted thereto but it may be a COB (capacitor over bit line) structure.

Further, in the exemplary embodiments described above, while descriptions have been made to a case where the connection plug just over the diffusion layer is a Cu plug, the material for the connection plug is not restricted thereto but may be a copper-containing metal or may be other conductive materials.

Further, in the exemplary embodiments described above, materials for respective interlayer insulation films have no particular restriction and, for example, can be a silicon oxide film. Further, the materials for respective barrier metals include, for example, TiN, Ta, and TaN.

Further, it is noted that Applicant's intent is to encompass equivalents of all claim elements, even if amended later during prosecution.

What is claimed is:

1. A method of manufacturing a semiconductor device, comprising:
   forming first and second connection plugs at a substantially identical level over a semiconductor substrate;
   forming a lower electrode covering an upper surface of the first connection plug and an electrode covering an upper surface of the second connection plug, the electrode being disposed apart from the lower electrode;
   forming a first insulation film covering the lower electrode and the electrode;
   selectively removing the first insulation film to expose a portion over a surface of the lower electrode, thereby forming a concave portion with an upper surface of the lower electrode being as a bottom surface, and with a lateral side of the first insulation film being as a side wall;
   forming a capacitor dielectric film for covering the upper surface of the lower electrode, the side wall of the first insulation film, and an upper surface of the first insulation film, from the bottom of the concave portion to an outside of the concave portion over the first insulation film formed with the concave portion;
   forming an upper electrode opposed to the lower electrode and in contact with the capacitor dielectric film so as to fill an inside of the concave portion;
   removing the first insulation film over the electrode selectively to form a connection hole after the forming the upper electrode; and
   forming a first conduction film so as to fill the connection hole and removing the first conduction film disposed to an outside of the connection hole, thereby forming a third connection plug to be connected with the second connection plug via the electrode.

2. The method of manufacturing a semiconductor device according to claim 1,
   wherein the second connection plug is disposed in contact with an impurity diffusion region disposed on the semiconductor substrate.

3. The method of manufacturing a semiconductor device according to claim 2, further comprising:
   forming a gate electrode above the semiconductor substrate;
   forming first and second impurity diffusion regions on sides of the gate electrode; and
   forming a second insulation film for covering the semiconductor substrate,
   wherein the forming of the first and the second connection plugs includes:
      selectively removing the second insulation film over the first and second impurity diffusion regions, thereby forming first and second connection holes; and
      forming a second conduction film comprising a copper-containing metal film so as to fill the first and second connection holes and removing the second conduction film disposed to an outside of the connection holes, thereby forming the first and second connection plugs connected to the first and second impurity diffusion regions.

4. The method of manufacturing a semiconductor device according to claim 1, further comprising:
   forming a bit line to be connected to the third connection plug.

5. The method of manufacturing a semiconductor device according to claim 1,
   wherein the first conduction film includes a copper-containing metal.

6. The method of manufacturing a semiconductor device according to claim 1, further comprising:

after forming the upper electrode, forming an interlayer insulation film over the upper electrode and the first insulation film, and removing a portion of the interlayer insulation film over the electrode.

7. The method of manufacturing a semiconductor device according to claim 1, wherein the upper electrode comprises a TiN film disposed on the capacitor dielectric film and a W film disposed on the TiN film.

8. The method of manufacturing a semiconductor device according to claim 1, wherein the lower electrode is disposed entirely below the first insulation film.

9. The method of manufacturing a semiconductor device according to claim 1, wherein the lower electrode and the electrode are formed substantially simultaneously.

* * * * *